(12) United States Patent  (10) Patent No.: US 8,957,513 B2
Xiao et al.  (45) Date of Patent: Feb. 17, 2015

(54) SEMICONDUCTOR DEVICE WITH EMBEDDED INTERCONNECT PAD (71) Applicants: Ke Xiao, Shanghai (CN); Henry K. Hong, Roseville, CA (US); Gunaranjan Viswanathan, Folsom, CA (US)

(72) Inventors: Ke Xiao, Shanghai (CN); Henry K. Hong, Roseville, CA (US); Gunaranjan Viswanathan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/038,546

(22) Filed: Sep. 26, 2013

(65) Prior Publication Data

US 2014/0027907 A1 Jan. 30, 2014

Related U.S. Application Data (62) Division of application No. 12/495,589, filed on Jun. 30, 2009, now Pat. No. 8,580,609.

(51) Int. Cl.
H01L 23/02 (2006.01)
H01L 23/522 (2006.01)
(Continued)

(52) U.S. Cl.
CPC ........ *H01L 23/5226* (2013.01); *H01L 23/3121* (2013.01); *H01L 23/49551* (2013.01); *H01L 23/49558* (2013.01); *H01L 24/73* (2013.01); *H01L 25/0657* (2013.01); *H01L 25/105* (2013.01); *H01L 23/49811* (2013.01); *H01L 2224/32145* (2013.01); *H01L 2224/48091* (2013.01); *H01L 2224/48145* (2013.01); *H01L 2224/48227* (2013.01); *H01L 2224/4824* (2013.01); *H01L 2224/49175* (2013.01); *H01L 2224/73207* (2013.01); *H01L 2224/73265* (2013.01); *H01L 2225/06506* (2013.01); *H01L 2225/0651* (2013.01); *H01L 2225/06527* (2013.01); *H01L 2225/06562* (2013.01); *H01L 2924/01013* (2013.01); *H01L 2924/01029* (2013.01); *H01L 2924/01082* (2013.01); *H01L 2924/14* (2013.01); *H01L 2924/15331* (2013.01); *H01L 24/48* (2013.01); *H01L 24/49* (2013.01); *H01L 2924/01005* (2013.01); *H01L 2924/01006* (2013.01); *H01L 2924/01033* (2013.01);
(Continued)

(58) Field of Classification Search
USPC ........... 257/686, 737, 738, E23.069, E21.499
See application file for complete search history.

(56) References Cited

U.S. PATENT DOCUMENTS 6,303,997 B1 * 10/2001 Lee .............................. 257/778
6,337,510 B1 1/2002 Chun-Jen et al.
(Continued)

OTHER PUBLICATIONS

Non-Final Office Action for U.S. Appl. No. 12/495,589 mailed Feb. 2, 2011, 9 pgs.
(Continued)

Primary Examiner — Timor Karimy
(74) Attorney, Agent, or Firm — Blakely, Sokoloff, Taylor & Zafman LLP (57) ABSTRACT A semiconductor device comprising: a lower semiconductor package that comprises a first set of one or more semiconductor dies, an upper semiconductor package that is stacked on the lower semiconductor package, the upper semiconductor package comprises a second set of one or more semiconductor dies, and a first interconnect pad that is embedded in a top side of the lower semiconductor package to couple the upper semiconductor package to the lower semiconductor package.

23 Claims, 8 Drawing Sheets (51) Int. Cl.
*H01L 23/31* (2006.01)
*H01L 23/495* (2006.01)
*H01L 23/00* (2006.01)
*H01L 25/065* (2006.01)
*H01L 25/10* (2006.01)
*H01L 23/498* (2006.01)

(52) U.S. Cl.
CPC ............. *H01L2224/32225* (2013.01); *H01L 2924/19107* (2013.01); *H01L 2225/1023* (2013.01); *H01L 2225/1041* (2013.01); *H01L 2225/1058* (2013.01); *H01L 2924/10253* (2013.01)
USPC .... 257/686; 257/738; 257/737; 257/E23.069; 257/E21.499

(56) References Cited

U.S. PATENT DOCUMENTS

| | | | |
|---|---|---|---|
| 6,448,110 B1 * | 9/2002 | Chen et al. | 438/109 |
| 7,119,427 B2 | 10/2006 | Kim | |
| 7,645,634 B2 * | 1/2010 | Karnezos | 438/107 |
| 7,692,311 B2 | 4/2010 | Fan et al. | |

OTHER PUBLICATIONS

Final Office Action for U.S. Appl. No. 12/495,589 mailed Nov. 17, 2011, 10 pgs.

Notice of Allowance and Fees for U.S. Appl. No. 12/495,589 mailed Jun. 26, 2013, 12 pgs.

* cited by examiner

SEMICONDUCTOR DEVICE WITH EMBEDDED INTERCONNECT PAD

BACKGROUND

For some package-on-package semiconductor systems, a top package and a bottom package may have different functions and/or structures. In some other systems, external leadframe based package-on-package structure may be used. Further, some systems may require top-bottom interconnect on package periphery like through mold via (TMV) that may impact X-Y dimensions for high inputs/outputs.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

FIGS. 1A-6 are schematic diagrams of a method to manufacture a semiconductor device with a package-on-package structure according to some embodiments of the invention.

DETAILED DESCRIPTION

In the following detailed description, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numbers refer to the same or similar functionality throughout the several views.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The following description may include terms, such as upper, lower, top, bottom, first, second, etc. that are used for descriptive purposes only and are not to be construed as limiting.

Figure 1A:
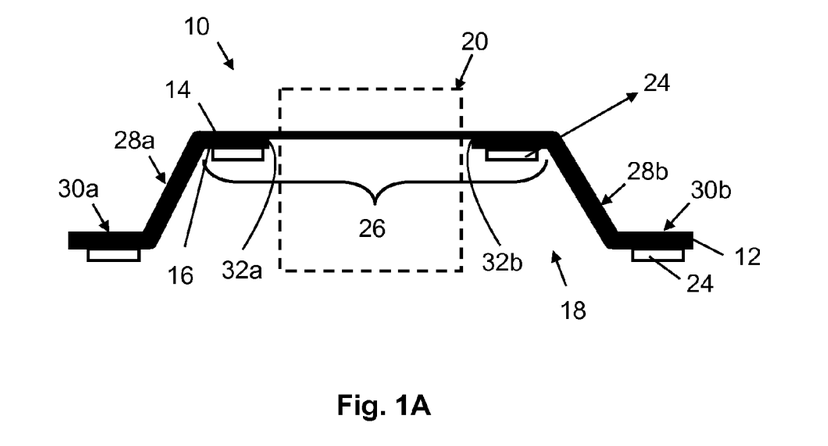

FIGS. 1A-6 are schematic diagrams of a method according to some embodiments of the invention. Referring to FIGS. 1A and 1B, an embedded interposer 10 may be prepared. As shown in FIG. 1A, a leadframe interposer 10 may be prepared. FIG. 1A illustrates a side view of the leadframe interposer 10 according to some embodiments of the present invention; and FIG. 1B is a schematic top view of the leadframe interposer 10. In one embodiment, the leadframe interposer 10 may comprise one or more leads 12 that may extend on a longitudinal direction of the leadframe interposer 10. The leadframe interposer 10 may be viewed as having an upper surface 14 and a lower surface 16.

Figure 2:
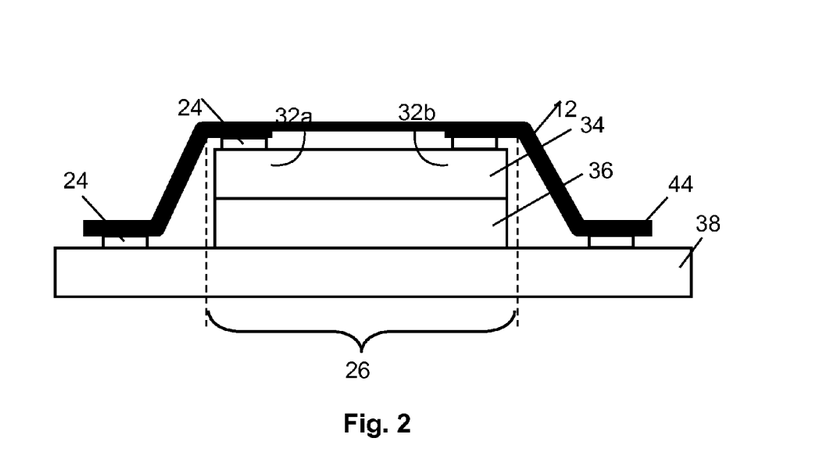

Referring to the side view of FIG. 1A, the leadframe interposer 10, e.g., the leads 12, may be folded to provide a cavity 18 under the leadframe interposer 10 to accommodate, e.g., one or more dies to be provided on a substrate (FIG. 2). For example, along a longitudinal direction of the leads 12, the leadframe interposer 10 (the leads 12) may be folded to provide a flat portion 26, two folded portions 28a and 28b on both sides of the flat portion 26, and two flat end portions 30a and 30b that each connect with respective folded portion 28a and 28b. In one embodiment, the flat portion 26 may have a width that is slightly bigger than that of one or more dies (FIG. 2) to be placed in the cavity 18. In another embodiment, the width of the flat portion 26 may be substantially equal to that of the one or more dies. In yet another embodiment, the folded portion 28a and 28b may be inclined; however, in some embodiments, the folded portion 28a and 28b may be vertical.

Figure 1B:
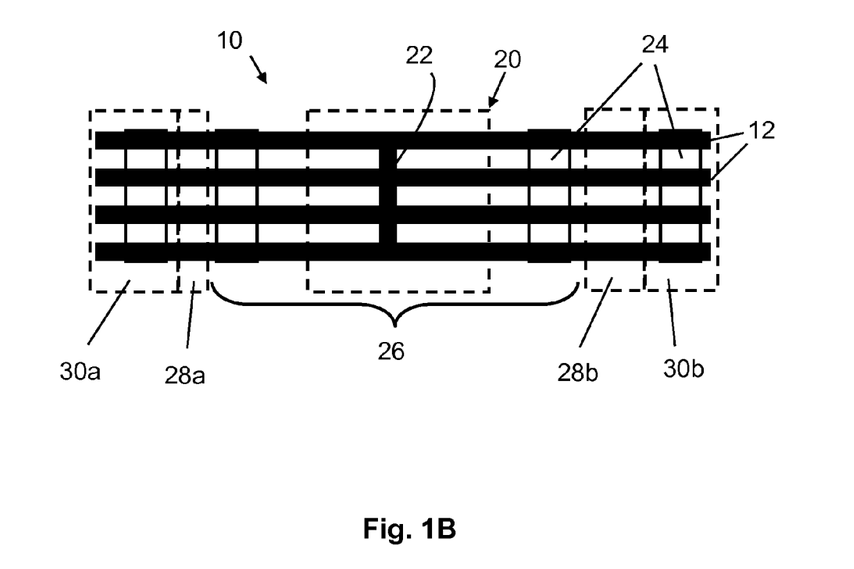

Referring to FIG. 1B, the flat portion 26 may comprise a transition portion 20 that may be located in the middle of the flat portion 26; however, in some embodiments, the transition portion 20 may not locate in the middle of the flat portion 26, but approach to a left end or a right end of the flat portion 26. In one embodiment, a rib portion 22 may be provided in the transition area 20 to maintain an interval between adjacent leads 12; however, in some embodiments, more rib portions may be provided in the transition area 20. In some embodiments, the rib portion may not be required and an interval between adjacent leads 12 may be provided by an adhesive 24. In some embodiments, the interval between adjacent leads 12 may not be the same. The rib portion 22 may intersect with the leads 12. In another embodiment, the rib portion 22 may be perpendicular to the leads 12. In another embodiment, the leads 12 and the rib portion 22 may be formed integrally. Example materials for the leads 12 and/or the rib portion 22 may comprise copper, aluminum and/or other suitable conductive materials or any combination thereof.

Referring to FIG. 1A, the flat portion 26 may comprise a transition portion 20 and two step portions 32a and 32b on two sides of the transition portion 20 along a longitudinal direction of the leadframe interposer 10. In one embodiment, a recess may be formed in a lower portion of the flat portion 26 to provide the transition portion 20. In one embodiment, the flat portion 20 may be etched from a lower side to provide the transition portion 20. For example, the transition area 20 may have a thickness that is a half of a thickness of the other part of the flat portion 26; however, in some embodiments, the transition area 20 may have a different thickness. Any other suitable methods may be used to reduce a thickness of the flat portion to provide the transition portion 20, including, but not limited to, milling or the like.

Referring to FIGS. 1A and 1B, an adhesive 24 may be provided on a lower surface 16 of the step portions 32a and 32b. For example, the adhesive 24 may be provided on a periphery of the transition portion 20. In another embodiment, the adhesive 24 may be provided on the lower surface 16 between the transition portion 20 and two folding points A and B on two ends of the flat portion 26. In another embodiment, the step portions 32a and 32b may each have a width that allows an amount of adhesive 24 to be provided on the lower surface 16 to attach each lead 12 in the step portions 32a and 32b to a die (FIG. 2). Any suitable adhesive may be used, including die attach adhesive, adhesive tape or the like. In another embodiment, the adhesive 24 may further be provided on the lower surface 16 of each end portion 30a and 30b to attach an end 44 of each lead 12 in the end portion 30a and 30b to a substrate (FIG. 2). As shown in FIG. 1B, the adhesive 24 may form one or more columns that may each extends along a direction that traverses the leads 12.

While FIG. 1A illustrates that an upper side of the transition portion 20 and the upper surface 14 may be on the same level, in some embodiments, the transition portion 20 may protrude the upper surface 14. In some embodiment, the rib portion 22 and the transition portion 20 may have the same thickness; however, in some embodiments, the rib portion 22 may have a different thickness. In some embodiments, the rib portion 22 may be provided on top of the transition portion 20. In yet another embodiment, the rib portion 22 may not be required.

Figure 16:
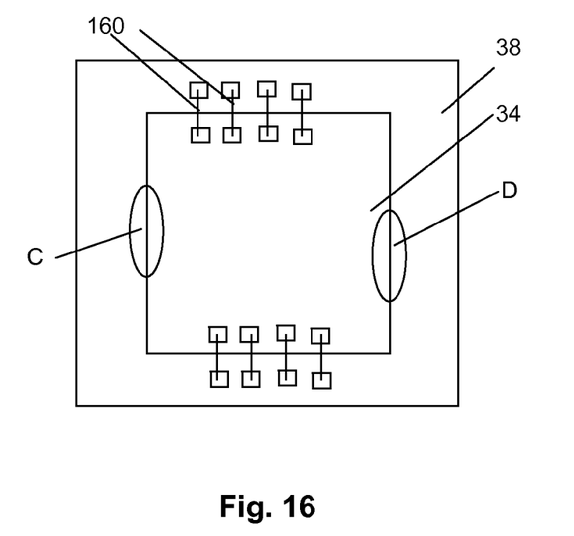
FIG. 16 is a schematic top view to illustrate a die that is coupled to a substrate according to an embodiment of the present invention.

Referring now to FIG. 2, the leadframe interposer 10 may be provided on a stack of a top die 34 and a lower die 36; however, in some embodiment, the stack may comprise one or more dies. In some embodiments, the die 34 and 36 may comprise semiconductor dies that may each provide an integrated circuit device or any other semiconductor circuits. The stack of the dies 34 and 36 may be provided on a substrate 38. The dies 34 and 36 may be accommodated in the cavity 18 formed by the leadframe interposer 10. In one embodiment, the top die 34 and the lower die 36 may be electrically coupled to the substrate 38 via one or more interconnects, e.g., bond wires 160 as shown in FIG. 16; however, in some embodiments, the dies 34 and 36 may be electrically coupled to the substrate 38 via any other interconnects, such as vias, plated through holes. The flat portion 26 may be placed on the top die 34. Each lead 12 in the step portions 32a and 32b may be attached to the top die 34 by the adhesive 24 on the step portions 32a and 32b. An end 44 of each lead 12 in the end portion 30a and 30b may be attached to the substrate 38 by the adhesive 24 on the end portions 30a and 30b.

Figure 3:
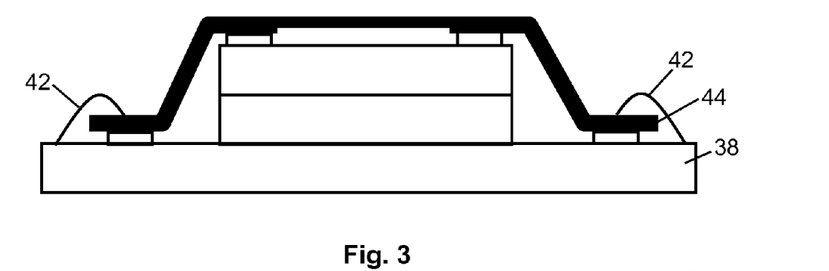

Referring to FIG. 3, an end 44 of each lead 12 may be electrically coupled to the substrate 38 via a bond wire 42. Referring to FIG. 16, in some embodiments, the one or more dies 34 and 36 may be electrically couple to the substrate 38 via corresponding bond wires 160, respectively. For example, the bond wires 160 may be provided on an edge of the dies 34 and 36. In another embodiment, the leadframe interpose 10 may be provided on another edge of the dies 34 and 36 where the bond wires 160 may not be located, e.g., C and D in FIG. 16. In one embodiment, the substrate 38 may comprise one or more pads (not shown) that may each couple to a bond wire 42.

Figure 4:
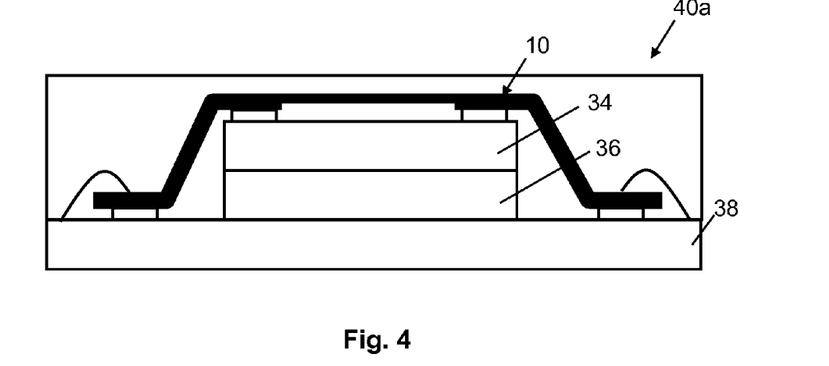
Figure 5:
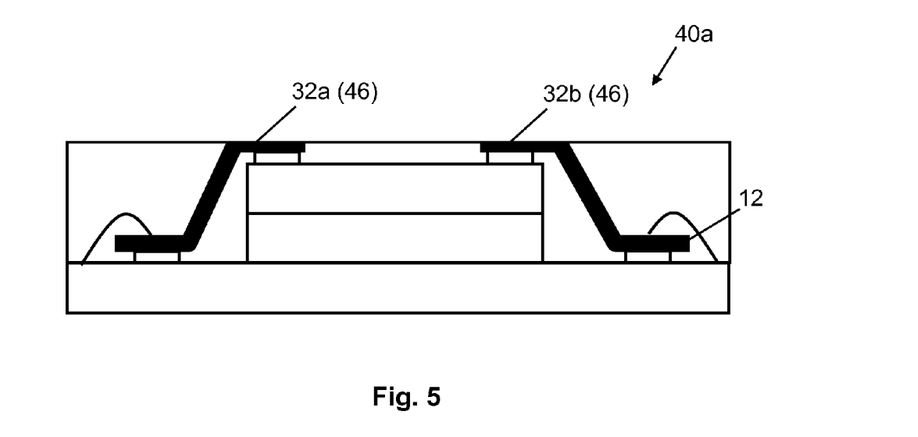
Figure 6:
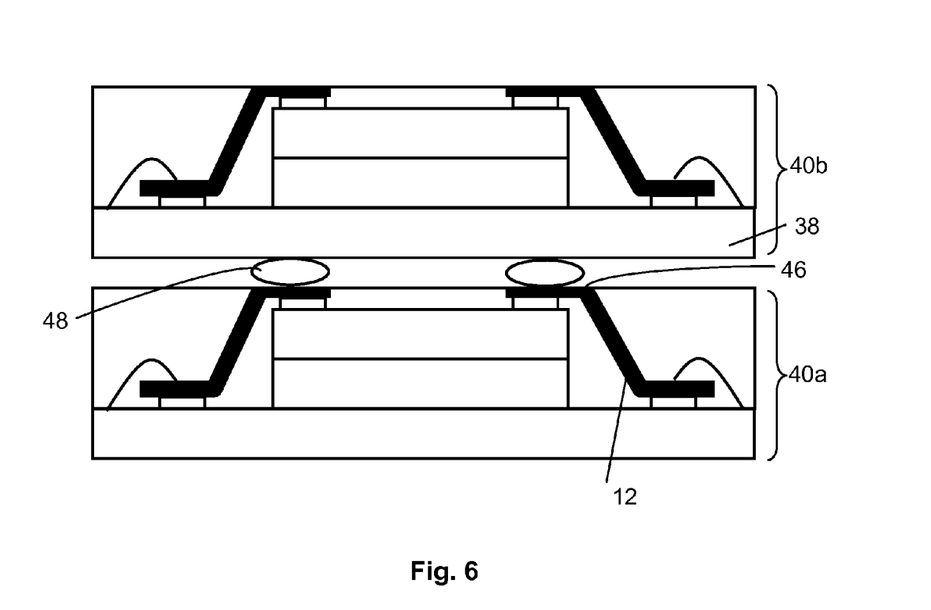

Referring to FIG. 4, an encapsulant or molding compound such as epoxy resin may be used to encapsulate the leadframe interposer 10, the dies 34 and 36 and the substrate 38 and any other interconnects to form a first semiconductor package 40a. Referring to FIG. 5, a top surface of the first package 40a may be grinded to remove the transition portion 20 of the leadframe interposer 10. In one embodiment, the grinding of FIG. 5 may expose the step portion 32a and 32b that may each correspond to one or more exposed end 46 of the leads 12. In one embodiment, an exposed end 46 may be served as a pad to be coupled to a solder pad on a top semiconductor package by a solder ball (FIG. 6). In some embodiments, the one or more dies 34 and 36 may be coupled to the substrate 38 via one or more wire bonds 42. In some embodiment, the substrate 38 may comprise one or more external interconnects, e.g., ball grid array (BGA), land grid array (LGA) or the like.

Referring now to FIG. 6, a second semiconductor package 40b may be formed according to FIGS. 1A to 6. The second package 40b may be stacked on the first package 40a to form a stack 60. In one embodiment, the second package 40b may be electrically and/or mechanically coupled to the first package 40a by one or more solder balls 48. A solder ball 48 may couple a solder pad (not shown) of a substrate 38 on bottom of the second package 40b to a corresponding exposed end 46 of a lead 12. In one embodiment, each lead 12 may be connected to a conductive path (not shown) in the stack 60. Referring to FIGS. 1A and 6, in one embodiment, a dimension and/or a location of the transition portion 20 and/or the step portions 30a and 30b for a lower package, e.g., the first package 40a, may be determined based on a location of a solder pad (not shown) on a top package, e.g., the second package 40b in the stack 60. In some embodiments, an exposed lead 12 in a lower package may be aligned with a solder pad on bottom of a top package.

While FIG. 6 illustrates the second package 40b may have the same structure as the first package 40a, in some embodiments, the second package 40b may not comprise the embedded interposer 10 or the leads 12. In some embodiments, the second package 40b may have a different structure with respect to the first package 40a. For example, a number of dies in a first package 40a and a second package 40b may not be the same.

Figure 7:
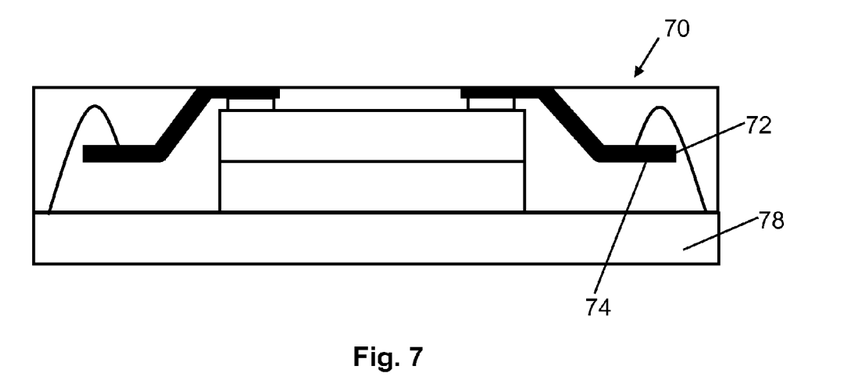
FIG. 7 is a schematic diagram of a semiconductor package with an embedded interconnect pad according to some embodiments of the invention.

FIG. 7 illustrates a semiconductor package 70 according to another embodiment of the present invention. Referring to FIG. 7, the semiconductor package 70 may have a structure that is similar to the semiconductor package 40a of FIG. 4 except that one end 74 of a lead 72 may not attach to the substrate 78. In some embodiments, the end 74 of the lead 72 may not be folded to be flat. In one embodiment, the leadframe interposer 10 of FIGS. 1A and 1B may be modified to have a reduced height from the flat portion 26 to the end portions 30a and 30b to form the semiconductor package 70. In another embodiment, an adhesive 24 on the end portions 30a and 30b as shown in FIGS. 1A and 1B may not be required in the embodiment of FIG. 7. In one embodiment, two or more semiconductor packages 70 may be stacked and electrically coupled in a same way as shown in FIG. 6 to provide a semiconductor apparatus.

Figure 8:
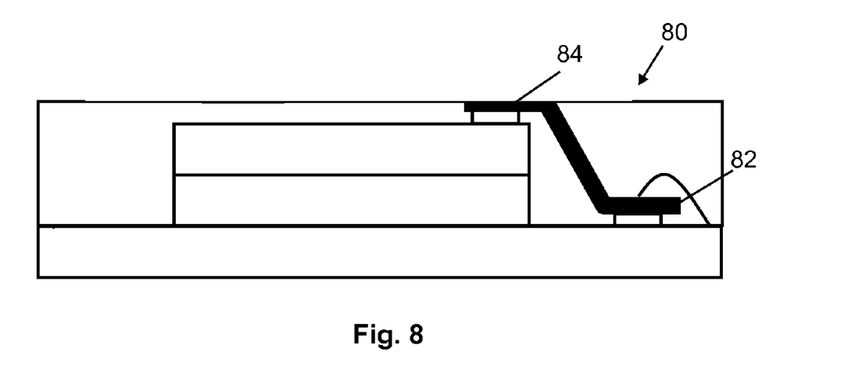
FIG. 8 is a schematic diagram of a semiconductor package with an embedded interconnect pad according to some embodiments of the invention.

FIG. 8 illustrates a semiconductor package 80 according to yet another embodiment of the present invention. Referring to FIG. 8, the semiconductor package 80 may have a structure that is similar to the semiconductor package 40a of FIG. 4 except that the semiconductor package 80 may only comprise the leads 82 on a right side; however, in some embodiment, the semiconductor package 80 may only comprise the leads on a left side.

Figure 13A:
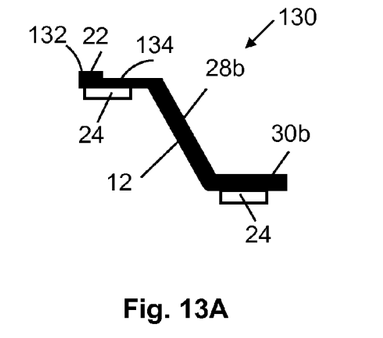
FIGS. 13A and 13B are schematic diagrams of a leadframe interposer that may be used to form the structure of FIG. 8.
Figure 13B:
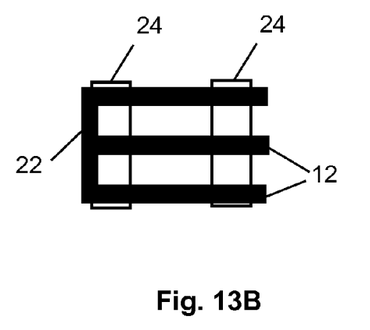

FIGS. 13a and 13b respectively illustrate a schematic side view and a top view of a leadframe interposer 130 that may be used to form the semiconductor package 80. Referring to FIGS. 13A and 13B, the leadframe interposer 130 may be slightly different from the leadframe interposer 10 in that a top surface 132 at the rib portion 22 may be higher than a top surface 134 of a lead 12. In one embodiment, a length and/or a position of a exposed solder pad 84 for a lower semiconductor package (not shown) may be determined to match a location of a solder pad on a lower side of a top semiconductor package (not shown). While FIGS. 13A and 13B illustrates an embodiment of a leadframe interposer 130, in some embodiments, a right side of the leadframe interposer 10 (from the rib portion 22 to the end portion 30b) may be used to form the semiconductor package 80.

Figure 9:
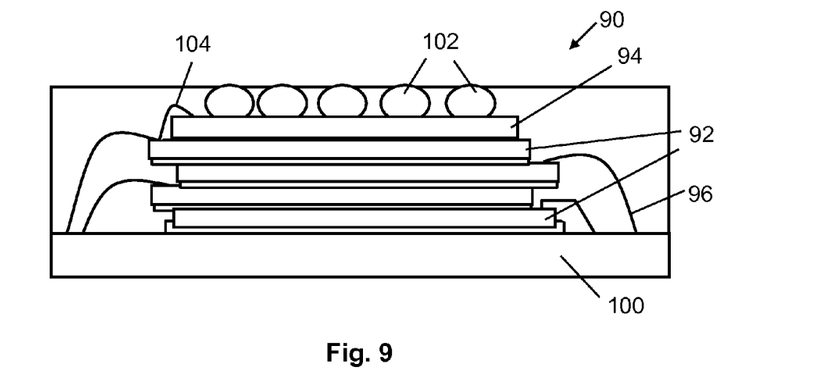
FIGS. 9 and 10 are schematic diagrams of a method to manufacture a semiconductor device with a package-on-package structure according to some embodiments of the invention.
Figure 10:
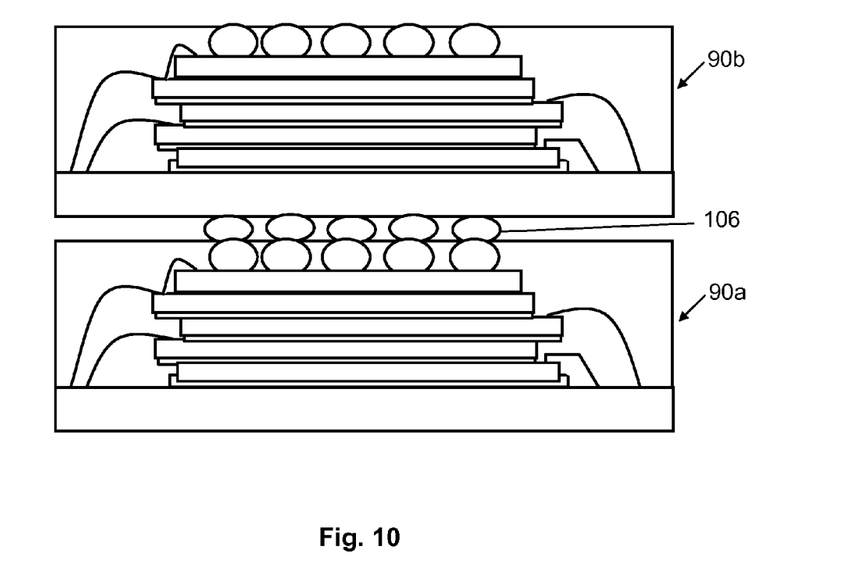

FIGS. 9-10 are schematic diagrams of a method according to some embodiments of the present invention. Referring to FIG. 9, a schematic sectional diagram of a first semiconductor package 90a according to some embodiments of the present invention is illustrated. Referring to FIG. 9, in some embodiments, one or more stacked semiconductor dies 92 may be provided on a substrate 100. In some embodiments, a semiconductor die 92 may provide a integrated circuit device or any other semiconductor circuits. In one embodiment, the stacked dies 92 may be offset with each other to accommodate one or more wires 96 on one end of each die 92. In one embodiment, each wire 96 may be bonded to a corresponding pad (not shown) on the substrate 100 to couple a die 92 to the substrate 100; however, any other interconnects may be utilized to couple a die 92 to the substrate 100. For example, in some embodiment, a die 92 may be couple to the substrate 100 by vias and/or plated through holes or the like and the dies 92 may be aligned to each other.

In one embodiment, a silicon die 94 may be utilized to provide an embedded interposer. The silicon die 94 may be provided on top of the stacked dies 92. The silicon die 94 may be attached to a top die in the stacked dies 92. The silicon die 94 may comprise Al or Cu traces (not shown) on a top surface of the silicon die 94. In some embodiments, the traces on the silicon die 94 may form a daisy chain, however, in some embodiments, the silicon die 94 may comprise any other conductive circuitry. In some embodiments, a trace on the silicon die 94 may selectively couple to a bond wire 104 and/or a solder bump 102. In another embodiment, the silicon die 94 may be wire bonded to the top die of the stacked dies 92. One or more solder bumps 102 may be attached to the top surface of the silicon die 94 to couple to corresponding traces on the silicon die 94. While FIG. 9 illustrates solder bumps 102, in some embodiments, other suitable interconnects may be utilized, including but not limited to, solder balls or the like.

The silicon die 94 with the solder bumps 102 exposed on a lower package (e.g., package 90a) may be served as an interposer to electrically couple a top package to a lower package; however, in some embodiments, any other suitable semiconductor materials may be used for the die 94. In one embodiment, under bump metallurgy (UBM) may be utilized to enhance solderablility between the solder balls 102 and the trances. In one embodiment, the stacked dies 92, the silicon die 94 and the solder bumps 102 may be molded to form the semiconductor package 90a. In another embodiment, the semiconductor package 90a may be grinded to expose at least a portion of each solder bump 102. The exposed solder bump 102 in a lower package 90a may provide an embedded pad for an interconnect 106 to electrically couple a top package 90b to the lower package 90a (FIG. 10). In one embodiment, the package 90a may further comprise one or more bond wires 104 to electrically couple the silicon die 94 to a top die 92 that may further electrically couple to the substrate 100; however, in some embodiments, the silicon die 94 may couple to the substrate 100 directly. While FIGS. 9 and 10 may illustrate using bond wires to electrically couple one or more components in the package 90a or 90b, in some embodiments, any other suitable interconnects may be utilized, including, e.g., vias or plated through holes.

Referring to FIG. 10, a second semiconductor package 90b may be formed according to FIG. 9. In one embodiment, the second semiconductor package 90b may be stacked on the first semiconductor package 90a. The second semiconductor package 90b may be coupled to the first semiconductor package 90a by one or more solder balls 106 that may each couple an outer solder pad (not shown) on a lower side of the second package 90b to an exposed solder ball 102 on the first package 90a. In one embodiment, a location of an exposed solder ball 102 may match a location of an outer solder pad on a lower side of the second package 90b.

Figure 11:
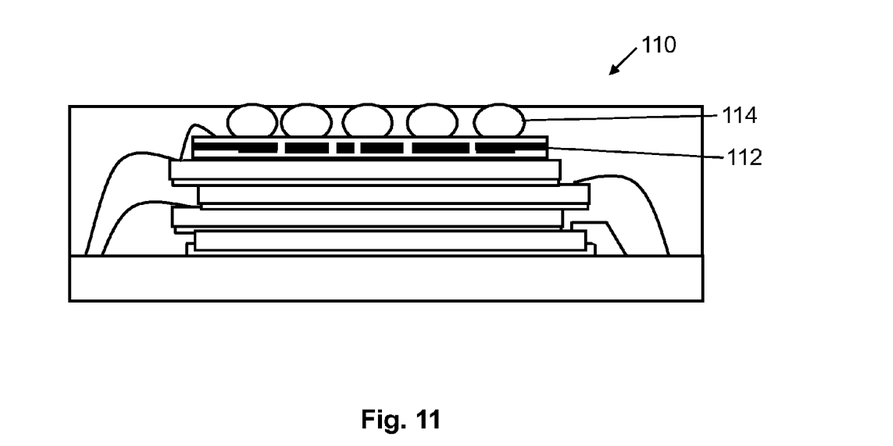
FIGS. 11 and 12 are schematic diagrams of a method to manufacture a semiconductor device with a package-on-package structure according to some embodiments of the invention.
Figure 12:
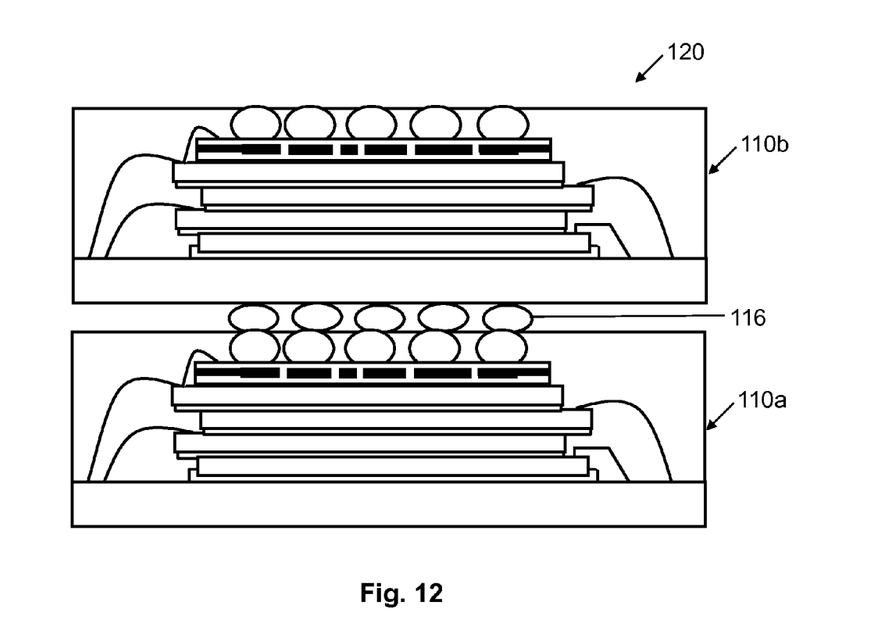
Figure 14:
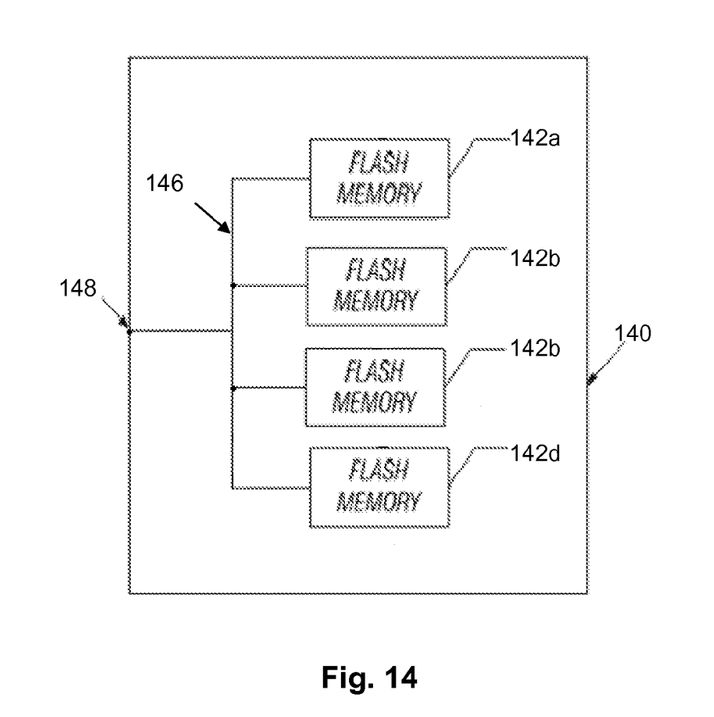
FIG. 14 is a schematic diagram of a memory system.

FIGS. 11-12 are schematic diagrams of a method to manufacture a package-on-package structure according to some embodiments of the present invention. Referring to FIG. 11, a schematic sectional diagram of a first semiconductor package 110a according to some embodiments of the present invention is illustrated. The semiconductor package 110a in FIG. 11 is similar to the semiconductor package 90a in FIG. 9 except that the semiconductor package 110a may comprise an internal or embedded substrate 112 that may be used as an embedded interposer to form the package stack 120 (FIG. 14). In one embodiment, one or more solder balls 114 may be electrically and mechanically coupled to the substrate 112. The semiconductor package 110a may be molded to expose at least a portion of each solder bump 114.

Referring to FIG. 12, a second semiconductor package 110b may be formed according to FIG. 11. Similarly, the second semiconductor package 110b may be stacked on the first semiconductor package 110a. The second semiconductor package 110b may be coupled to the first semiconductor package 110a by one or more solder balls 116 that may each couple an outer solder pad (not shown) on a lower side of the second package 110b to an exposed solder bump 114 on the first package 110a. In one embodiment, a location of an exposed solder bump 114 may match a location of an outer solder pad on a lower side of the second package 110b. In one embodiment, the exposed solder bump 114 may provide an interconnect pad to couple a top package 110b to a lower package 110a by a solder ball 116.

While FIGS. 1A-14 are illustrated to comprise a sequence of processes, the methods in some embodiments may perform illustrated processes in a different order.

In one embodiment, the package of FIG. 6-12 may be used to provide a memory system. FIG. 14 illustrates an embodiment of a memory system 140 that may be formed in one semiconductor package or in a package-on-package structure. In one embodiment, the memory system 140 may comprise a universal serial bus (USB) flash memory or any other memories. For example, the memory system 140 may comprise four flash memories 142a, 142b, 142c and 142d that may be coupled to I/O terminal 138. In one embodiment, the flash memories 142a-142d may be implemented by the semiconductor dies 34, 36 of FIG. 6, respectively. However, in some embodiments, the memory system 140 may comprise a different number of flash memories that may each provided by a semiconductor die of stacked dies.

One or more interconnects 136 may couple the flash memories 142a-142d and the I/O terminal 138 that may couple to a control (not shown). In some embodiments, the interconnect 136 may comprise leads 12, solder ball 48 and other suitable internal or external interconnects, as shown in FIG. 6. In some embodiment, the interconnect 136 may comprise bond wires 96, 104, solder bump 10, solder balls 106 and/or other suitable internal or external interconnects, as shown in FIG. 10. In one embodiment, the memory system 140 may be coupled to the external I/O 138 via a substrate and/or external interconnects (not shown). Although the embodiment of FIG. 14 is illustrated to use four flash memories, in some embodiments, other memory devices may be utilized, such as NOR, NAND, dynamic random access memory (DRAM). In one embodiment, the memory system 140 may further comprise a control (not shown) that may be implemented by one or more dies in a package of FIGS. 6-12. For example, the control may comprise a memory controller, a digital signal processor (DSP), a processor, logic circuit or any other control unit or device. For example, the control may be coupled to each of the memory devices 142a-142d. In another embodiment, the control may be coupled to the external I/O terminal 138 via a substrate (not shown).

Figure 15:
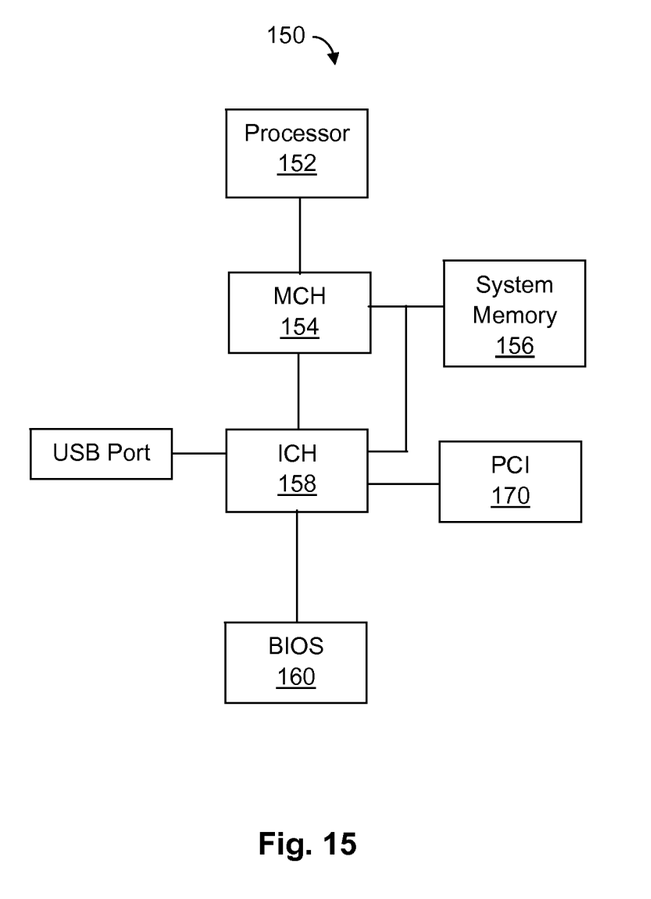
FIG. 15 is a schematic diagram of a computing system.

FIG. 15 illustrates a block diagram of an exemplary embodiment of a computing system 150 that may comprise a processor based system. The computing system 150 may comprise a processor 152 that may be coupled to a memory controlled hub (MCH) 154. MCH 154 may be coupled to an I/O controller hub (ICH) 158. The MCH 154 may support access to a system memory 156. For example, the system memory 156 may comprise DDR and/or dual in line memory (DIMM), or any other memory. In some embodiments, the system memory 156 may comprise an integrated circuit device of FIGS. 6, 10, and 12. The ICH 158 may couple to BIOS (basic I/O system) 160 that may be stored in non-volatile memory (e.g., a flash memory, a firmware hub, etc.). In another embodiment, the ICH 158 may support, e.g., PCI port 170 and USB port. In one embodiment, the BIOS 160 may provide instructions and operations to initialize the computing system 150.

While FIGS. 1A-16 may schematically illustrate to comprise a certain number of dies, interconnects, substrates, IC devices, components, some embodiments may apply to a different number and a different arrangement. In some embodiments, the package-on-package structure may avoid package periphery interconnections and may bring interconnect for package stacking to top of a bottom package to reduce X-Y impact. In some embodiments, a top package and a bottom package may be similar in form, size, and/or function to facilitate system design. Some embodiments may have interconnect pad on top of the package to facilitate ball-outs.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. A semiconductor device comprising:
   a lower semiconductor package that comprises a first set of one or more semiconductor dies,
   an upper semiconductor package that is stacked on the lower semiconductor package, the upper semiconductor package comprises a second set of one or more semiconductor dies, and
   a first interconnect pad that is to couple the upper semiconductor package to the lower semiconductor package, wherein the first interconnect pad comprises a first lead that is encapsulated in the lower semiconductor package, wherein the first lead comprises a first flat portion on one end of the first lead, wherein a top side of the lower semiconductor package is grinded to expose at least a portion of the first flat portion from the top side of the lower semiconductor package to provide the first interconnect pad, and wherein the exposed first flat portion is on the first set of one or more dies and the other end of the first lead is wire bonded to a lower substrate of the lower semiconductor package.

2. The semiconductor device of claim 1, wherein the first interconnect pad comprises a solder bump that is exposed from the top side of the lower semiconductor package, the solder bump is coupled to an embedded substrate that is provided on a top die in the first set of dies.

3. The semiconductor device of claim 1, wherein the first interconnect pad comprises a solder bump that is exposed from the top side of the lower semiconductor package, the solder bump is coupled to a embedded silicon die that is provided on a top die of the first set of dies.

4. The semiconductor device of claim 1, wherein the second set of dies are provided on and coupled to an upper substrate that is further coupled to the first interconnect pad by a solder ball.

5. The semiconductor device of claim 1, further comprising:
   a solder ball that is provided between the upper semiconductor package and the lower semiconductor package, wherein the solder ball couples the exposed first flat portion of the first lead to an upper substrate of the upper semiconductor package.

6. The semiconductor device of claim 2, further comprising:
   a solder ball that is provided between the upper semiconductor package and the lower semiconductor package, wherein the solder ball couples to the exposed solder bump to couple the exposed solder bump to an upper substrate of the upper semiconductor package.

7. The semiconductor device of claim 3, wherein the exposed solder bump couples to a lower substrate of the lower semiconductor package by a solder ball.

8. The semiconductor device of claim 1, wherein the first interconnect pad is coupled to the lower semiconductor package via a top die of the second set of dies.

9. A memory system, comprising:
   a stack of an upper semiconductor package and a lower semiconductor package to provide the memory system, wherein the lower semiconductor package comprises a first stack of one or more memory devices and the upper semiconductor package comprises a second stack of one or more memory devices, and
   a first interconnect pad that is to couple the upper semiconductor package to the lower semiconductor package, wherein the first interconnect pad comprises a first lead that is encapsulated in the lower semiconductor package, wherein one end of the first lead is attached to a top memory device in the first stack of one or more memory devices and the other end of the first lead is wire bonded to a lower substrate of the lower semiconductor package, wherein a top surface of the lower semiconductor package is grinded to expose at least a portion of the one end of the first lead from the top surface of the lower semiconductor package to provide the first interconnect pad.

10. The memory system of claim 9, wherein the first interconnect pad comprises a solder bump that is exposed from the top side of the lower semiconductor package, the solder bump is coupled to an embedded substrate that is provided on a top die in the first set of dies.

11. The memory system of claim 9, wherein the first interconnect pad comprises a solder bump that is exposed from the top side of the lower semiconductor package, the solder bump is coupled to an embedded silicon die that is provided on a top die of the first set of memory devices.

12. The memory system of claim 9, wherein the second set of memory devices are provided on and coupled to an upper substrate that is further coupled to the first interconnect pad by a solder ball.

13. The memory system of claim 9, further comprising:
a solder ball that is provided between the upper semiconductor package and the lower semiconductor package, wherein the solder ball is to couple the exposed one end of the first lead to an upper substrate of the upper semiconductor package.

14. The memory system of claim 10, further comprising:
a solder ball that is provided between the upper semiconductor package and the lower semiconductor package, wherein the solder ball couples to the exposed solder bump to couple the exposed solder bump to an upper substrate of the upper semiconductor package.

15. The semiconductor device of claim 1, wherein the first set of one or more semiconductor dies comprises two or more stacked semiconductor dies.

16. The semiconductor device of claim 1, wherein the other end of the first lead is attached to the lower substrate.

17. The semiconductor device of claim 1, further comprising:
a second interconnect pad that is to couple the upper semiconductor package to the lower semiconductor package, wherein the second interconnect pad comprises a second lead that is encapsulated in the lower semiconductor package, wherein one end of the second lead comprises a second flat portion above the first set of one or more semiconductor dies, wherein the other end of the second lead is wire bonded to the lower substrate, and wherein at least a portion of the second flat portion is exposed from the top side of lower semiconductor package to provide the second interconnect pad in response to the grinding of the top side of the lower semiconductor package; and
an adhesive that is to attach the first flat portion and the second flat portion to a top die of the first set of one or more semiconductor dies, wherein the adhesive is to provide an interval between the first flat portion and the second flat portion.

18. The semiconductor device of claim 17, wherein the first lead and the second lead are on one side of the first set of one or more semiconductor dies.

19. The semiconductor device of claim 1, further comprising:
a third interconnect pad that is to couple the upper semiconductor package to the lower semiconductor package, wherein the third interconnect pad is provided on another side of the first set of one or more semiconductor dies, wherein the third interconnect pad comprise a third lead that is encapsulated in the lower semiconductor package, and wherein the third lead comprises a third flat portion that is exposed from the top side of the lower semiconductor package.

20. The memory system of claim 9, wherein the other end of the first lead is attached to the lower substrate.

21. The memory system of claim 9, further comprising:
a second interconnect pad that is to couple the upper semiconductor package to the lower semiconductor package, wherein the second interconnect pad comprises a second lead that is encapsulated in the lower semiconductor package, wherein one end of the second lead is attached to a top memory device in the first stack of one or more memory devices and the other end of the second lead is wire bonded to a lower substrate of the lower semiconductor package, wherein a top surface of the lower semiconductor package is grinded to expose at least a portion of the one end of the second lead from the top surface of the lower semiconductor package to provide the second interconnect pad in response to the grinding of the top surface of the lower semiconductor package; and
an adhesive that is to attach the one end of the first lead and the one end of the second lead to the top surface of the lower semiconductor package, wherein the adhesive is to provide an interval between the first lead and the second lead.

22. The memory system of claim 21, wherein the first lead and the second lead are on one side of the first stack of one or more memory devices.

23. The memory system of claim 9, further comprising:
a third interconnect pad that is to couple the upper semiconductor package to the lower semiconductor package, wherein the third interconnect pad is provided on another side of the first stack of one or more memory devices, wherein the third interconnect pad comprise a third lead that is encapsulated in the lower semiconductor package, and wherein one end of the third lead is exposed from the top surface of the lower semiconductor package.

* * * * *